United States Patent [19]

Knapek et al.

[11] Patent Number: 4,837,125
[45] Date of Patent: Jun. 6, 1989

[54] ELECTRON-BEAM-SENSITIVE RESIST MATERIAL FOR MICROSTRUCTURES IN ELECTRONICS

[75] Inventors: Erwin Knapek, Unterhaching; Helmut Formanek, Garching, both of Fed. Rep. of Germany

[73] Assignee: Siemens Aktiengesellschaft, Berlin and Munich, Fed. Rep. of Germany

[21] Appl. No.: 17,982

[22] Filed: Feb. 24, 1987

[30] Foreign Application Priority Data

Mar. 25, 1986 [DE] Fed. Rep. of Germany ....... 3610087

[51] Int. Cl.$^4$ .............................................. G03C 5/00
[52] U.S. Cl. .................... 430/270; 430/276; 430/540; 430/913; 430/925
[58] Field of Search ............... 430/270, 296, 540, 942, 430/297, 298, 913, 925

[56] References Cited

U.S. PATENT DOCUMENTS

| | | | |
|---|---|---|---|
| 3,554,794 | 1/1971 | Geisler et al. | 430/296 X |
| 3,985,915 | 10/1976 | Gipstein et al. | 427/43 |
| 4,032,691 | 6/1977 | Kido et al. | 428/304 |
| 4,517,276 | 5/1985 | Lewis | 430/192 |

FOREIGN PATENT DOCUMENTS 1163490  3/1984  Canada ............................... 430/297

OTHER PUBLICATIONS

Hawley, Condensed Chemical Dictionary, 10th Ed., Van Nostrand Reinheld, New York, 1981, p. 834.
H. W. Deckman and J. H. Dunsmuir, PMMA Electron Resists with Narrow Molecular Weight Distribution, J. Vac. Sci. Technology, vol. 1, No. 4, Oct.-Dec. 1983, pp. 1166-1170.
L. Reimer, Electronmikroskopische Untersuchungs-und Praparations Methoden, Springer-Verlag, Berlin-Heidelberg-New York, 1967, Chapter 15.6, pp. 330-331.

Primary Examiner—Jose G. Dees

[57] ABSTRACT

An electron-beam-sensitive resist material is provided that includes film having high-polymers and includes dopings. The material is made into a solution that is added to the substrate so that the resist material can be produced on the semiconductive or piezoelectric substrates by drying. The doping additives of the resist material can include: halogens, halogen compounds, peroxides, kaotropic salts and xanthates. The resist material is used for the production of electron-beam-written microstructures with high structural resolution and, in comparison to the known methods, eliminates the error-affected developing process.

12 Claims, 1 Drawing Sheet

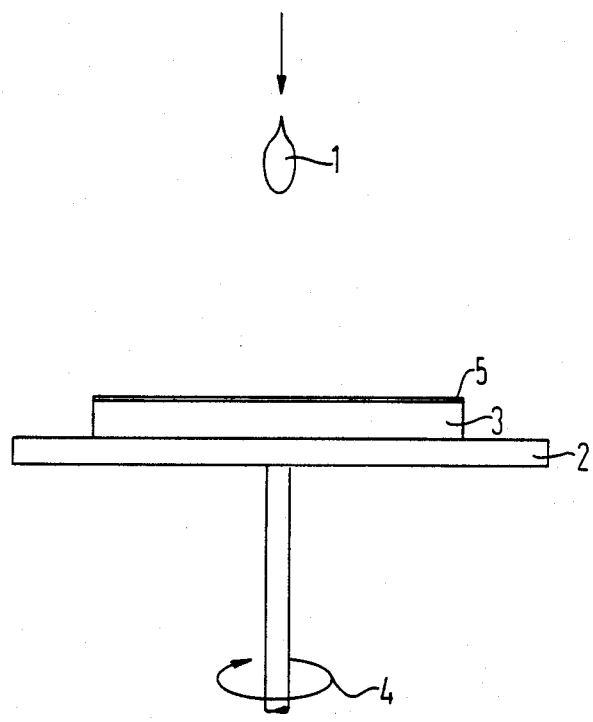

ELECTRON-BEAM-SENSITIVE RESIST MATERIAL FOR MICROSTRUCTURES IN ELECTRONICS

BACKGROUND OF THE INVENTION

The present invention generally relates to an electronbeam-sensitive resist material. More specifically, the present invention relates to an electron-beam-sensitive resist material for the manufacture of microstructures in electronics that are generated on substrates of semiconductive or piezoelectric materials.

It is known to generate microstructures on substrates of semiconductive or piezoelectric materials with electron-beamsensitive resist materials. For example, in the manufacture of very large scale integrated (VLSI) circuits it is known to use polymethyl methacrylate lacquers (PMMA). These PMMA lacquers are described in detail in an article by H.W. Deckman and J.H. Dunsmuir entitled: "PMMA Electron Resists With Narrow Molecular Weight Distribution" in the periodical J. Vac. Sci. Technol. Vol. 1 No. 4, Oct.–Dec. 1983, on pages 1166 through 1170. To manufacture the microstructures, PMMA lacquers are applied to the semiconductor substrates in thin layers. After the PMMA lacquers are applied they are provided with a structure through the use of an electron beam and, following irradiation by the electron beam are subjected to a developing process in which the lacquer structure serves as masking is generated.

However, typical known electron-beam-sensitive materials are not entirely satisfactory. For example, it is difficult to reproduce a layer of lacquer having a thickness. Moreover, as a result of the interaction of electron-beam-sensitive resist material (for example, PMMA) that is exposed with the writing electron beam, a following development step is necessary to create the microstructure. This development step is typically fraught with errors.

Accordingly, an improved electron-beam-sensitive resist material for the manufacture of microstructures in electronics generated on substrates of semiconductive or piezoelectric materials is needed.

SUMMARY OF THE INVENTION

The present invention provides an improved electronbeam-sensitive resist material for the manufacture of microstructures in electronics generated on substrates of semiconductive or piezoelectric materials. To create the electron-beam-sensitive resist material of the present invention high polymer films including dopings of halogens, halogen compounds, and peroxides are utilized. Examples of dopings that have been found to function satisfactorily are: bromine and/or iodine—as a doping halogen; iron(III) chloride—as a doping halogen compound; and dibenzoyl peroxide doping—as a peroxide. The high polymer film and dopings that create the resist material are added to the substrate while the resist material is in a solution. The resist film is produced by drying the solution on the substrate.

The solution can additionally include kaotropic salts and/or xanthates. The kaotropic salt can be, for example, calcium rhodanide and the xanthate can be, for example, potassium xanthate. The doped films can include natural and artificial high polymers, i.e., high polymers produced by artificial synthesis and polymerization. Examples of high polymers that can comprise the high polymer constituent of the doped film include: polyvinyl dimethoxymethane; nitro-cellulose; acetyl cellulose; or derivatives thereof.

In an embodiment of the invention, the layer thickness of the resist film on the substrate is between approximately 10 nm to about 1000 nm. One can vary the thickness of resist film in response to the type and concentration of the doping employed.

A method for the manufacture of the electron-beam-sensitive resist material is also provided. The method comprises dissolving the high-polymer material in an organic solvent in a concentration in the range of approximately 0.1 to about 1%. The solution is provided with a doping additive or doping additives in a concentration in the range of approximately 0.1 to about 1%. The doped plastic solution is dripped onto the surface of the substrate in a quantity corresponding to the selected layer thickness and is caused to dry in film form.

In an embodiment of the method, the substrate holder with the substrate secured thereto is placed in whirling motion during the drip-on of the solution. In an embodiment, acetone or ethanol is employed as the solvent.

BRIEF DESCRIPTION OF THE DRAWING

The drawing illustrates a perspective view of resist film being applied to the substrate.

DETAILED DESCRIPTION OF THE PRESENTLY PREFERRED EMBODIMENTS

An improved beam-sensitive-resist material for the manufacture of microstructures in electronics generated on substrates of semiconductive or piezoelectric materials is provided. The resist material includes a high-polymer film that includes a doping. The doping can include halogens, halogen compounds, or peroxides.

"Electronmikroskopische Untersuchungs- und Praparationsmethoden" by L. Reimer, Springer-Verlag, BerlinHeidelberg-New York, 1967, Chapter 15.6, pages 330–331, discloses a method wherein perforated foils are developed for transmission electron microscopy. Pursuant to the method, the whole diameter of these foils are capable of being varied from 10 nm to 10000 nm. The perforated foil is created by shooting holes in pre-treated plastic foils with the assistance of electron beams; intensities of $10^{-6}$ through $10^{-4}$ Coulombs/cm$^2$ are sufficient for this purpose.

The present invention exploits and expands upon the Reimer observations to manufacture microstructures and to this end provides an entirely new electron resist. Pursuant to the present invention, the electron beam treatment can ensue immediately after the resist has been produced on the semiconductor substrate; a following developing step is not necessary.

By way of example, and not limitation, the invention shall be set forth in greater detail below with reference to an exemplary embodiment. The exemplary embodiment relates to the manufacture of doped foil on a semiconductor substrate of silicon. Crystal wafers of $A^{III}B^{V}$ compounds or of piezoelectric materials such as, for example, lithium niobate, as employed for the manufacture of surface-wave filters, can also be utilized as substrates.

To create the electron-beam-sensitive resist material, approximately 0.1 to about 1.0% of a plastic or of a modified natural substance, for example polyvinyl dimethoxymethane, nitro-cellulose, or acetyl cellulose, and approximately 0.1 to about 1.0% of a dopant, for example, bromine or calcium rhodanide, are dissolved in an organic solvent, for example acetone or ethanol. Additionally, halogens, halogen compounds, peroxides, kaotropic salts, and xanthates can be added to the solution. The addition of halogens (such as, for example, chlorine or bromine) or halogen compounds (such as, for example, iron(III)chloride) or peroxides (such as, for example, dibenzoyl peroxide) initiates an increased radiation sensitivity; the addition of kaotropic salts (such as, for example, calcium rhodanide) disturbs hydrophobic interactions; and the addition of xanthates (such as, for example, potassium xanthate) suspends celluloses.

Referring to the drawing, a perspective view of the high-polymer solution 1 being applied to the silicon substrate wafer 3 is illustrated. The high-polymer solution 1, containing a defined concentration of the dopant, is applied in a defined quantity on the silicon substrate wafer 3 that is situated on a substrate holder 2. The substrate holder 2 is coupled to a lacquer whirler (see rotational arrow 4). The solution 1 is dried on the silicon substrate wafer 3. The resist film 5 formed on the surface of the silicon substrate wafer 3 can then be immediately exposed to electron beam exposure. The layer thickness of the film 5 is varied depending on quantity of the high-polymer constituent of the resist material, the doped solution 1 applied, and centrifugal force of the whirler 4.

In comparison to traditional lacquer coating of semiconductor substrates, the inventive coating films of the present invention, e.g., synthetics or cellulose derivatives, offer the following advantages: a uniformly thick coating can be easily achieved by variation of the concentration of the film materials in various solvents; as a result of the sublimation of the film material in the writing electron beam, the developing step that is necessary in traditional resist structuring, and that can typically be fraught with error, can be avoided; variation of the dopant allows one to increase the sensitivity to electron beams; the film resist allows one to write lines having widths as small as 10 nm with the electron beam; and reproducible different film thicknesses can be realized by varying the concentration of the film materials in the various solvents.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. An electron-beam-sensitive resist material for the manufacture of microstructure in electronics generated on substrates of semiconductive or piezoelectric materials comprising:
   a high polymer constituent chosen from the group consisting of polyvinyl dimethoxymethane, nitrocellulose, and acetyl cellulose;
   at least one dopant chosen from the group consisting of halogens, halogen compounds, and peroxides; and
   the resist material includes iron (III)chloride.

2. The electron-beam-sensitive resist material according to claim 1, wherein the solution additionally contains at least one of the compounds chosen from the group consisting of kaotropic salts and xanthates.

3. The electron-beam-sensitive resist material according to claim 1 wherein the layer thickness of the film on the substrate is between approximately 10 to about 1000 nm.

4. The electron-beam-sensitive resist material according to claim 1 wherein the resist material is composed of both natural as well as synthetic high-polymers.

5. The electron-beam-sensitive resist material according to claim 2 wherein the kaotropic salt is calcium rhodanide.

6. The electron-beam-sensitive resist material according to claim 2 wherein the xanthate is potassium xanthate.

7. An electron-beam-sensitive material for the manufacture of microstructure or piezoelectric materials comprising:
   a high polymer constituent chosen from the group consisting of polyvinyl dimethoxymethane, nitrocellulose, and acetyl cellulose;
   at least one dopant chosen from the group consisting of halogens, halogen compounds, and peroxides; and
   the resist material includes dibenzoyl peroxide.

8. The electron-beam-sensitive resist material of claim 7 wherein the resist material includes at least one compound chosen from the group consisting of kaotropic salts and xanthates.

9. The electron-beam-sensitive resist material according to claim 7 wherein the layer thickness of the film on the substrate is between approximately 10 to about 1000 nm.

10. The electron-beam-sensitive resist material according to claim 7 wherein the resist material is composed of both natural as well as synthetic high-polymers.

11. The electron-beam-sensitive resist material according to claim 8 wherein the kaotropic salt is calcium rhodanide.

12. The electron-beam-sensitive resist material according to claim 8 wherein the xanthate is potassium xanthate.

* * * * *